(12) United States Patent
Bai (10) Patent No.: US 10,658,592 B2
(45) Date of Patent: May 19, 2020

(54) METHOD FOR FABRICATING FLEXIBLE DISPLAY DEVICE, FLEXIBLE DISPLAY DEVICE, AND DISPLAY APPARATUS

(71) Applicant: Wuhan China Star Optoelectronics Semiconductor Display Technology Co., Ltd., Wuhan, Hubei (CN)

(72) Inventor: Sihang Bai, Guangdong (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/735,894

(22) PCT Filed: Aug. 22, 2017

(86) PCT No.: PCT/CN2017/098436
§ 371 (c)(1),
(2) Date: Dec. 12, 2017

(87) PCT Pub. No.: WO2019/024141
PCT Pub. Date: Feb. 7, 2019

(65) Prior Publication Data
US 2019/0036024 A1 Jan. 31, 2019

(30) Foreign Application Priority Data
Jul. 31, 2017 (CN) .......................... 2017 1 0644439

(51) Int. Cl.
*H01L 51/00* (2006.01)
*H01L 51/56* (2006.01)

(52) U.S. Cl.
CPC ........ *H01L 51/003* (2013.01); *H01L 51/0097* (2013.01); *H01L 51/56* (2013.01); *H01L 2227/326* (2013.01); *H01L 2251/5338* (2013.01)

(58) Field of Classification Search
CPC ... H01L 51/003; H01L 51/0097; H01L 51/56; H01L 2251/5338
See application file for complete search history.

(56) References Cited

U.S. PATENT DOCUMENTS

| 2008/0309867 A1 | 12/2008 | Kampstra |
| 2014/0250687 A1 | 9/2014 | Zhang et al. |

(Continued)

FOREIGN PATENT DOCUMENTS

| CN | 103325734 A | 9/2013 |
| CN | 104362077 A | 2/2015 |

(Continued)

*Primary Examiner* — Bilkis Jahan
*Assistant Examiner* — Victor V Barzykin
(74) *Attorney, Agent, or Firm* — Andrew C. Cheng (57) ABSTRACT

The present application discloses a method for fabricating a flexible display device, a flexible display device and a display apparatus, the method including: disposing a separation layer on a surface of a substrate; disposing a flexible substrate on a surface of the separation layer away from the substrate; disposing a display assembly on a surface of the flexible substrate away from the separation layer; separating the flexible substrate from the separation layer to obtain the flexible display device; wherein an adhesion between the flexible substrate and the surface of the substrate is greater than an adhesion between the separation layer and the surface of the flexible substrate, an adhesion between the separation layer and the surface of the substrate is greater than the adhesion between the separation layer and the surface of the flexible substrate. By the above method, the application can increase the yield of the flexible display device.

7 Claims, 5 Drawing Sheets

(56) References Cited

U.S. PATENT DOCUMENTS

2015/0123098 A1* 5/2015 Kang ................. H01L 51/5253
                                                        257/40
2015/0239210 A1   8/2015 Jeong et al.
2015/0303408 A1  10/2015 Lee et al.
2016/0347047 A1* 12/2016 Eguchi ................. B32B 43/006

FOREIGN PATENT DOCUMENTS

CN    105024017 A    11/2015
CN    105789440 A     7/2016

* cited by examiner

| separating the flexible substrate is through mechanical methods from the surface in contact with the separation layer, so that the flexible substrate is separated from the substrate, to obtain the flexible display device | — S141 |

FIG. 9

| cutting the boundaries of the laminated the separation layer and the flexible substrate by laser to form cutting lines | — S140 |

METHOD FOR FABRICATING FLEXIBLE DISPLAY DEVICE, FLEXIBLE DISPLAY DEVICE, AND DISPLAY APPARATUS

FIELD OF THE INVENTION

The present application relates to a semiconductor fabricating technology field, and more particularly to a method for fabricating a flexible display device, a flexible display device, and a display apparatus.

BACKGROUND OF THE INVENTION

The commonly used fabricating process of the flexible display device is depositing a flexible plastic thin film substrate on a glass substrate, such as polyimide thin film (PI film), so as to fix the flexible substrate, and continue to deposit other layers, and finally using the separating method of the laser lift off, LLO to separates the glass substrate and the flexible substrate. However, the electrostatic interaction between the flexible substrate and the glass substrate is stronger, an electrostatic damage is formed to the flexible substrate during the process of the conventional fabricating process, and affecting performance.

SUMMARY OF THE INVENTION

A technical problem that has been mainly solved by the present application is to provide method for fabricating a flexible display device, a flexible display device, and a display apparatus, and to solve the problem that the flexible substrate is easy to be damaged in the conventional technology.

In order to solve the above-mentioned technical problems, a technical aspect of the present application is to provide a flexible display device including: a flexible substrate and a display assembly disposed on a surface of the flexible substrate; wherein the flexible display device is obtained by the fabricating method includes: disposing a separation layer on a surface of a baseboard; disposing the flexible substrate on a surface of the separation layer away from the baseboard; disposing the display assembly on a surface of the flexible substrate away from the separation layer; separating the flexible substrate from the separation layer to obtain the flexible display device; an adhesion between the flexible substrate and the surface of the baseboard is greater than an adhesion between the separation layer and the surface of the flexible substrate, an adhesion between the separation layer and the surface of the baseboard is greater than the adhesion between the separation layer and the surface of the flexible substrate; wherein the flexible substrate is separated from the surface in contact with the separation layer by a mechanical method; and the display assembly including an inorganic film layer, a flexible baseboard, a barrier layer, a buffer layer, a display panel, and an encapsulation layer sequentially deposited on the surface of the flexible substrate away from the separation layer.

In order to solve the above-mentioned technical problems, a technical aspect of the present to application is to provide a method for fabricating a flexible display device, including: disposing a separation layer on a surface of a baseboard; disposing a flexible substrate on a surface of the separation layer away from the baseboard; disposing a display assembly on a surface of the flexible substrate away from the separation layer; separating the flexible substrate from the separation layer to obtain the flexible display device; and wherein an adhesion between the flexible substrate and the surface of the baseboard is greater than an adhesion between the separation layer and the surface of the flexible substrate, an adhesion between the separation layer and the surface of the baseboard is greater than the adhesion between the separation layer and the surface of the flexible substrate.

In order to solve the above-mentioned technical problems, a technical aspect of the present application is to provide a display apparatus including a flexible display device, the flexible display device including: a flexible substrate and a display assembly disposed on a surface of the flexible substrate; wherein the flexible display device is obtained by the fabricating method includes: disposing a separation layer on a surface of a baseboard; disposing the flexible substrate on a surface of the separation layer away from the baseboard; disposing the display assembly on a surface of the flexible substrate away from the separation layer; separating the flexible substrate from the separation layer to obtain the flexible display device; and an adhesion between the flexible substrate and the surface of the baseboard is greater than an adhesion between the separation layer and the surface of the flexible substrate, an adhesion between the separation layer and the surface of the baseboard is greater than the adhesion between the separation layer and the surface of the flexible substrate.

The advantageous effect of the present application is that, comparing to the conventional technology, a separation layer is provided between the baseboard and the flexible substrate, wherein the adhesion of the flexible substrate and the surface of the baseboard is greater than the adhesion of the separation layer and the surface of the flexible substrate, and the adhesion between the separation layer and the surface of the baseboard is greater than the adhesion of the separation layer and the surface of the flexible substrate, so that the separation layer can be easily separated from the flexible substrate, to achieve the separation of the flexible substrate from the baseboard, to obtain a flexible display device, the method can reduce the damage to the flexible substrate, reducing the impact to the performance of the flexible display device, and improving the fabricating yield of flexible display device.

BRIEF DESCRIPTION OF THE DRAWINGS

In order to more clearly illustrate the embodiments of the present application or prior art, the following FIG.s will be described in the embodiments are briefly introduced. It is obvious that the drawings are merely some embodiments of the present application, those of ordinary skill in this field can obtain other FIG.s according to these FIG.s without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Specifically, the terminologies in the embodiments of the present application are merely for describing the purpose of the certain embodiment, but not to limit the invention.

The present application will now be described in further detail with reference to the accompanying drawings and preferred embodiments.

Figure 1:
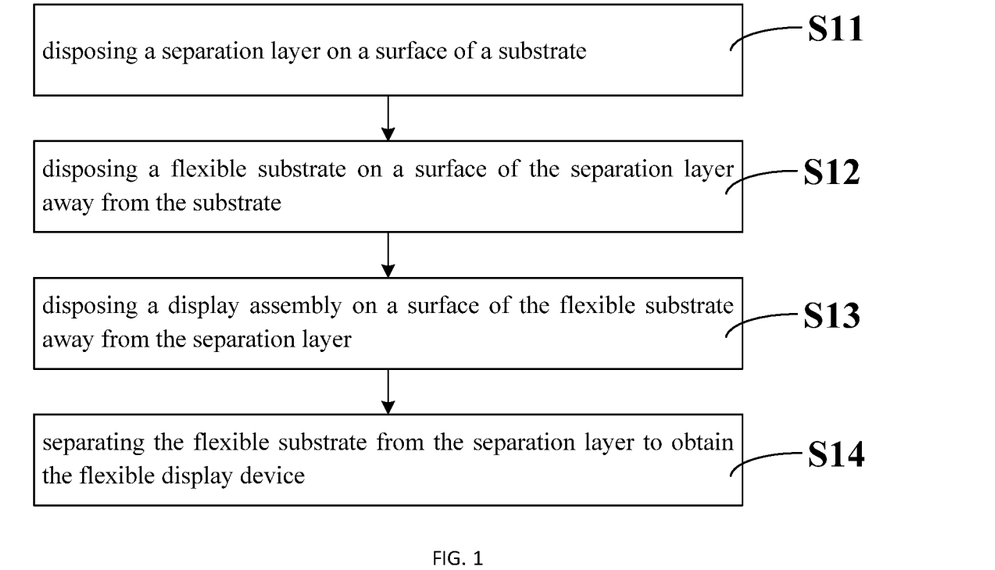
FIG. 1 is a schematic flow diagram of an embodiment of a method for fabricating a flexible display device according to the present application.

FIG. 1 is a schematic flow diagram of an embodiment of a method for fabricating a flexible display device according to the present application; As shown in FIG. 1, the method for fabricating the flexible display device of the present application includes:

Step S11: forming a separation layer on a surface of the baseboard; Wherein, the baseboard is a rigidity material, and it may be one or a combination of one or more of material selected from glass, metal, plastic, fiber or the like, the separation layer is the material with a larger adhesion with the baseboard and a smaller adhesion with the flexible substrate, and the separation layer is the material with an adhesion with the surface of the flexible substrate smaller than the adhesion of the flexible substrate to the baseboard, such as titanium dioxide nanoparticles.

Figure 2:
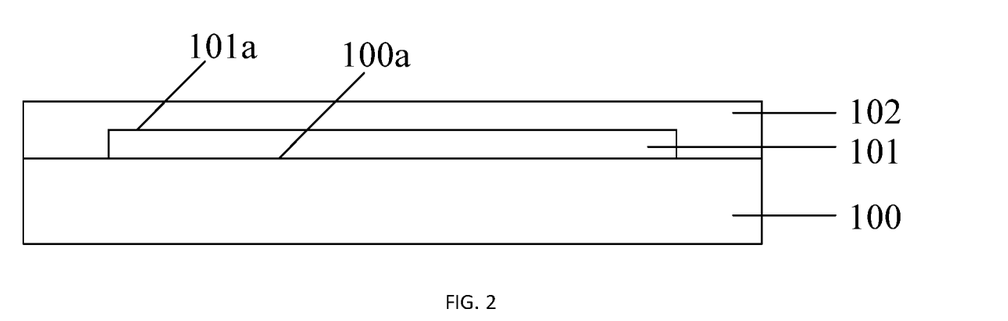
FIG. 2 is a schematic structural view of a lamination structure of a substrate baseboard, a separation layer, and a flexible substrate of an embodiment of the present application.

Combined with the illustration in FIG. 2, in one embodiment, the baseboard 100 is a glass baseboard, the material of the separation layer 101 is titanium dioxide nanoparticles; further, the step S11 includes:

Step S111: coating a solution containing titanium dioxide nanoparticles on a surface of the baseboard;

Wherein, the titanium dioxide nanoparticles have excellent chemical stability and thermal stability, so that in the follow-up high-temperature process, it can still maintain its morphology and performance; and the adhesion of the titanium dioxide nanoparticles to the glass baseboard is greater than the adhesion with the flexible substrate to facilitate the subsequent separation from the flexible substrate.

Step S112: performing a high-temperature annealing process to the solution to form a separation layer.

Wherein, the high-temperature annealing process refers to a heat treatment process for exposing the material in high-temperature for a long time, and then slowly cooling down, the high-temperature and time can be decided according to actual needs, here is not specifically limited.

Specifically, as shown in FIG. 2, a solution containing titanium dioxide nanoparticles is coated on the surface 100a of the glass baseboard 100, and then performing a high-temperature annealing process to the solution, and finally forming the separation layer 101 of titanium dioxide nanoparticles. By the heat-resistant characteristics of the titanium dioxide, during the high-temperature annealing process, the formed separation layer 101 still maintain its chemical stability and adhesion with the glass baseboard. Wherein, the thickness of the separation layer 101 may be determined depending on the specific requirements, for example, 1000 to 2000 μm, and is not specifically limited herein.

In the above embodiment, the separation layer is formed by a coating solution and a high-temperature annealing treatment, and the technical process is mature and the cost is low. Of course, in other embodiments, the separation layer may be fabricated by other processes such as physical or chemical deposition or other processes. The baseboard may be made of other materials such as metal, and the separation layer may be made of, for example, silicon dioxide and the like material with the adhesion with the baseboard is greater than the adhesion with the flexible substrate, and is not specifically limited herein.

Figure 3:
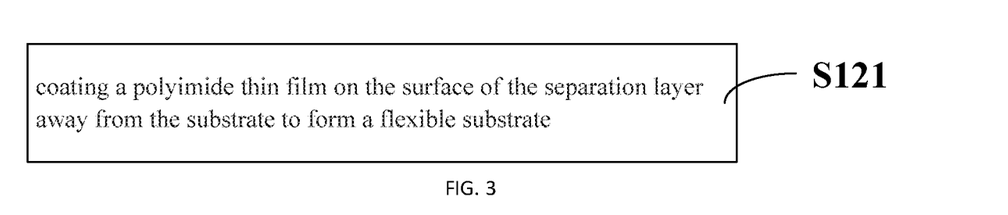
FIG. 3 is a schematic flow diagram of step S12 of FIG. 1.

Step S12: forming a flexible substrate on the surface of the separation layer away from the baseboard;

Wherein, the material of the flexible substrate may be made of one or a combination of more than one material selected from polyimide, PI, polyethylene terephthalate, PET, Polyethylene naphthalate, PEN, Polycarbonate, PC, Polyethersulfone, PES, Polyacrylate, PAR, Polyetherimide, Polyamide, PA or Polyetheretherketone, PEEK, or the like, and is not specifically limited herein. Further, as shown in FIG. 3, step S12 includes:

Step S121: coating a polyimide thin film on the surface of the separation layer away from the baseboard to form a flexible substrate.

Specifically, as shown in FIG. 2, the polyimide thin film is coated on the surface 101a of the separation layer 101 away from the baseboard 100 to form the flexible substrate 102. Wherein, the polyimide thin film is formed by coating process including scraper, spin coating, spraying, dip coating, screen printing and a combination of these methods. Of course, in other embodiments, the flexible substrate may also be fabricated using other processes, and is not specifically limited herein.

Figure 4:
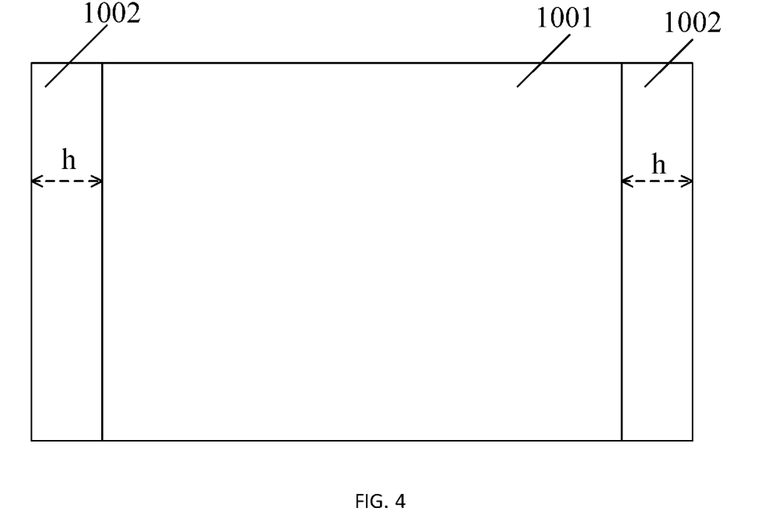
FIG. 4 is a plan view of the lamination structure of the substrate and the separation layer of an embodiment of FIG. 2.

Further, combining referring to the illustration of FIGS. 2 and 4, the separation layer 101 covers a first region 1001 of the surface 100a of the baseboard 100, and the flexible substrate 102 covers a second region 1002 of the surface 100a of the baseboard 100, wherein the second region 1002 is the surface 100a of the baseboard 100 not covering the separation layer 101.

Specifically, the separation layer 101 covers the first region 1001 of the surface 100a of the baseboard 100, the area of the first region 1001 is smaller than the area of the surface 100a of the baseboard 100, and the boundary of the first region 1001 and the boundary of the surface 100a of the baseboard 100 have a gap to form a second region 1002, a width h of the gap may be determined according to the actual demand, for example, 6 to 10 mm; in the same time for fabricating the flexible substrate 102 on the separation layer 101, the flexible substrate 102 covers the gap, that is, covering the second region 1002; since the adhesion between the separation layer 101 and the flexible substrate 102 is smaller and the adhesion between the flexible substrate 102 and the baseboard 100 is larger, by making the flexible substrate 102 to cover the second region 1002 of the surface 100a of the baseboard 100 can prevent the peeling phenomenon caused by the poor adhesion between the flexible substrate 102 and the separation layer 101.

Figure 5:
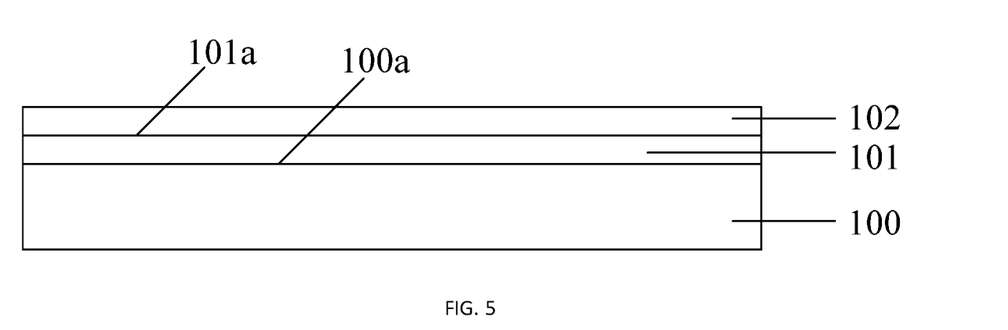
FIG. 5 is a schematic structural view of a lamination structure of the baseboard, the separation layer, and the flexible substrate of another embodiment of the present application.
Figure 6:
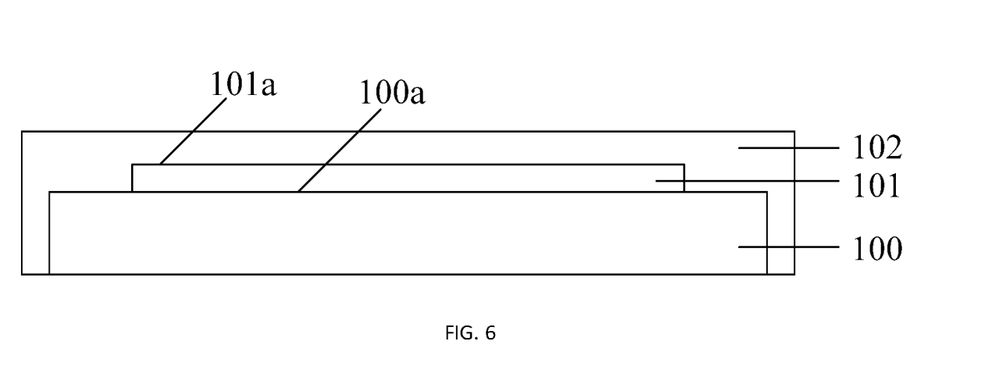
FIG. 6 is a schematic structural view of a lamination structure of the baseboard, the separation layer, and the flexible substrate of another embodiment of the present application.
Figure 7:
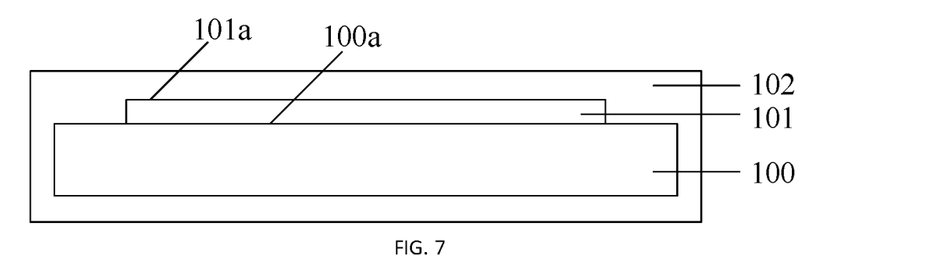
FIG. 7 is a schematic structural view of a lamination structure of the baseboard, the separation layer, and the flexible substrate of another embodiment of the present application.

Of course, in other embodiments, the separation layer 101 may completely cover the surface 100a of the baseboard 100, the flexible substrate 102 covers the surface 101a of the separation layer 101 away from the baseboard 100, as shown in FIG. 5; or the flexible substrate 102 covers the separation layer 101 the surface 101a of the separation layer 101 away from the baseboard 100 and covers a sidewall 1003 of the baseboard 100, as shown in FIG. 6; or the flexible substrate 102 covers the surface 101a of the separation layer 101 away from the baseboard 100, the sidewall 1003 of the baseboard 100, and an other surface 100b of the baseboard 100, as shown in FIG. 7; in addition, the flexible substrate 102 may partially cover the other surface 100b of the baseboard 100, no further embodiments and descriptions are presented here.

Step S13: fabricating a display assembly on a surface of the flexible substrate away from the separation layer;

Wherein, the display assembly fabricated on the flexible substrate includes at least one or a combination more than one of an inorganic film layer, a PI film layer, a barrier layer, a buffer layer, a display panel, and an encapsulation layer; wherein, electronic components can be fabricated on the display assembly include at least one or more combinations of resistors, capacitors, inductors, wires, transistors, diodes, the specific forms and locations of the electronic components, the connection relationship can be flexibly selected and set according to the specific device requirements, no further descriptions are presented here.

Figure 8:
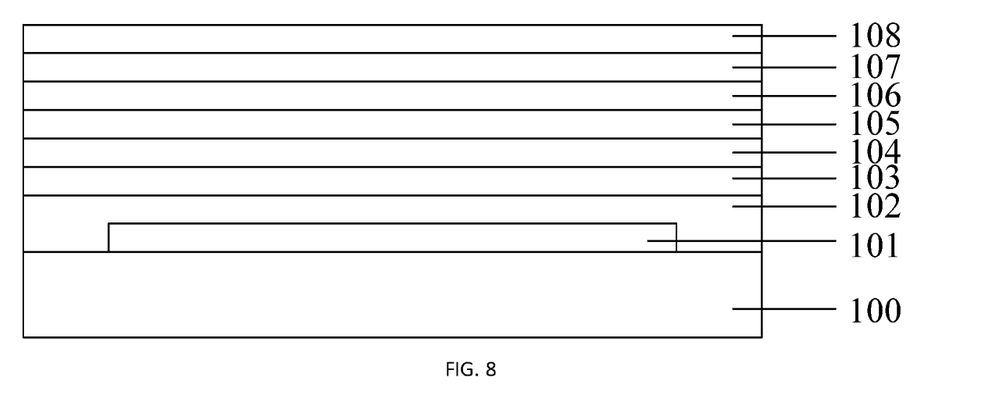
FIG. 8 is a schematic structural view of a lamination structure of the baseboard, the separation layer, the flexible substrate and a display assembly of an embodiment of the present application.

Specifically, in one embodiment, as shown in FIG. 8, an inorganic substrate 103, a flexible baseboard 104, a barrier layer 105, a buffer layer 106, a display panel 107, and an encapsulation layer 108 are sequentially deposited on a surface 102a of the flexible substrate 102 away from the separation layer 101. Wherein, the inorganic film layer 103 is made of a silicon dioxide material, and the flexible baseboard 104 is made of a material such as PI or PET, the barrier layer 105 and the buffer layer 106 are made of silicon nitride or silicon dioxide or a stacking structure of silicon nitride and silicon dioxide, the display panel 107 may be an active matrix organic light emitting diode panel (referred to as AMOLED), the encapsulation layer 108 using a waterproof material.

Of course, in other embodiments, the display panel may also be other types of display panels, and other display components and/or electronic components may be fabricated on the flexible substrate, and are not specifically limited herein.

Figure 9:
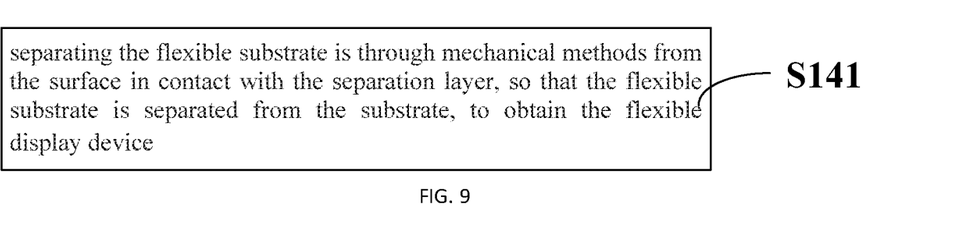
FIG. 9 is a schematic flow diagram of step S14 of FIG. 1.

Step S14: separating the flexible substrate from the separation layer to obtain a flexible display device;

Further, as shown in FIG. 9, step S14 includes:

Step S141: separating the flexible substrate is through mechanical methods from the surface in contact with the separation layer, so that the flexible substrate is separated from the baseboard, to obtain the flexible display device.

Wherein, through mechanical methods can be used by mechanical tools, or can also be used in other tools, or the use of manpower, etc., and are not specifically limited herein.

Specifically, in one embodiment, as shown in FIG. 5, since the adhesion between the separation layer 101 and the flexible substrate 102 is smaller, the flexible substrate 102 can be peeling from the surface 101a in contact with the separation layer 101 by a simple mechanical method, for example, by hand, so that the flexible substrate 102 is separated from the baseboard 100, to obtain a flexible display device composed of the flexible substrate 102 and the flexible display assembly fabricated thereon.

Figure 10:
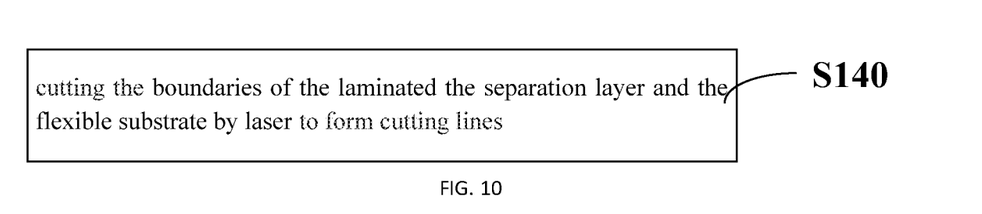
FIG. 10 is a schematic flow diagram of the step before step S141 of FIG. 9.
Figure 11:
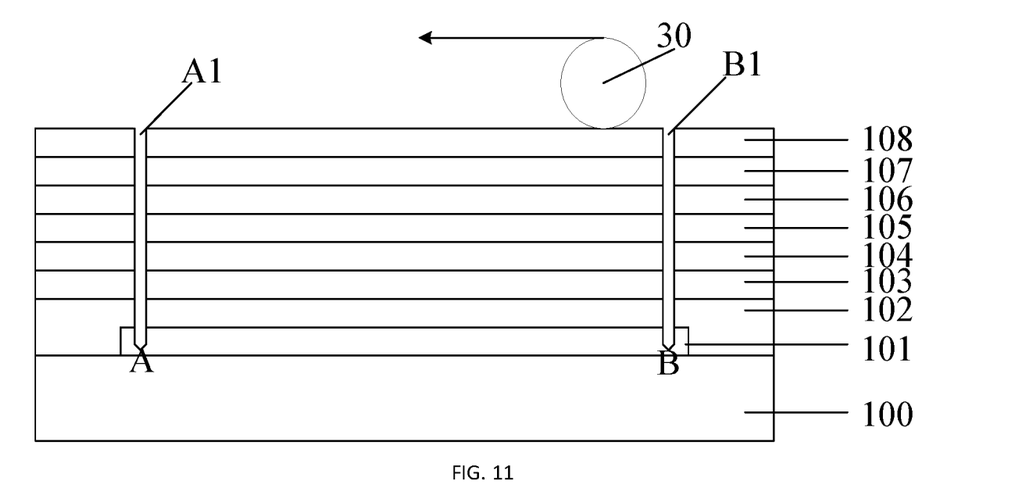
FIG. 11 is a schematic structural view for separating the flexible substrate and the separation layer by using of laser cutting and roller.

In another embodiment, further, as shown in FIG. 10, before step S141 further includes:

Step S140: cutting the boundaries of the laminated the separation layer and the flexible substrate by laser to form cutting lines Specifically, as shown in FIG. 11, taking the structure shown in FIG. 8 as an example, performing a laser beam perpendicular to the surface 102a of the flexible substrate 102 to cut the boundaries A, B of the laminated separation layer 101 and the flexible substrate 102 and to form cutting lines A1, B1; of course, in other embodiments, only one cutting line may be formed, or a plurality of cutting lines may be formed, and the cutting may be performed using structures similar to that shown in FIG. 5, FIG. 6 or FIG. 7, and is not specifically limited herein.

Figure 12:
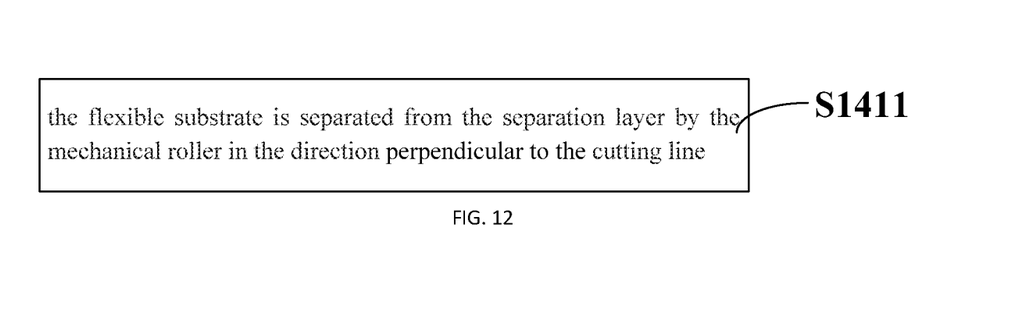
FIG. 12 is a schematic flow diagram of step S141 of FIG. 9.

In addition, due to the existence of high-temperature process in the process of fabricating the display assembly, the film shrinkage effect of the boundary of the flexible display device is obvious, affecting the device performance, the method described above, by laser cutting the boundary portion, can reduce the overall film shrinkage, and improve device performance. Alternatively, as shown in FIG. 12, step S141 specifically includes:

Step S1411: the flexible substrate is separated from the separation layer by the mechanical roller in the direction perpendicular to the cutting line.

Specifically, as shown in FIG. 11, the surface of the mechanical roller 30 is attached to the encapsulation layer 108, and the mechanical roller 30 is moved in the direction perpendicular to the cutting line A1 and/or B1 (the arrow direction shown in FIG. 11), since the adhesion between the separation layer 101 and the flexible substrate 102 is smaller, and smaller than the adhesion between the flexible substrate 102 and the baseboard 100. Therefore, it is possible to apply a pulling force to the flexible substrate 102 by moving the mechanical roller 30, to overcome the adhesion between the flexible substrate 102 and the separation layer 101, thereby separating the flexible substrate 102 from the separation layer 101.

In addition, by the above-mentioned mechanical separation method, it is possible to avoid the electrostatic damage to the flexible substrate caused by the high energy of the laser, to reduce the influence on the performance of the flexible display device, to improve the yield of the flexible display device, besides, the cost is low by using the mechanical separation method, it can effectively reduce the fabricating costs, more conducive to large-scale production.

Of course, in other embodiments, it is also possible to separate the flexible substrate and the separation layer in other ways, and is not specifically limited herein.

Figure 13:
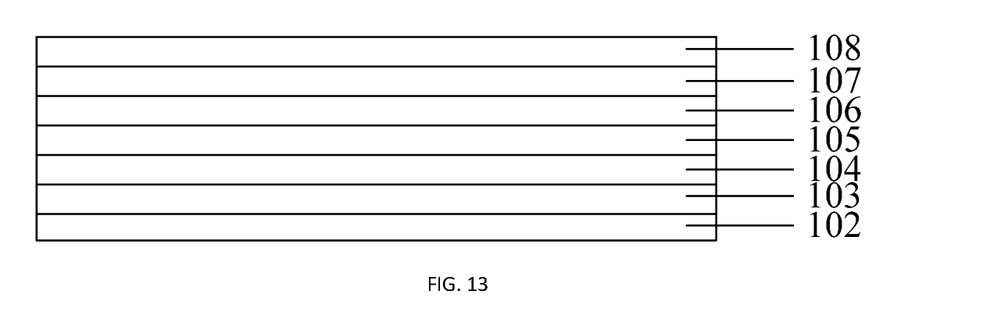
FIG. 13 is a schematic structural view of a flexible display device of an embodiment according to the present application.

Referring to FIG. 13, FIG. 13 is a schematic structural view of an embodiment of the flexible display device of the present application. As shown in FIG. 13, the flexible display device of the present application includes the flexible substrate 102, the inorganic film layer 103, the flexible baseboard 104, the barrier layer 105, the buffer layer 106, the display panel 107, and the encapsulation layer 108 laminated sequentially.

Wherein the flexible display device is obtained by the method for fabricating the flexible display device of the present application. The material and type of each layer can be referred to the description of step S13 in the fabrication method of the flexible display device of the present application, and will not be repeated here.

Of course, in other embodiments, the flexible display device may also include other structures, such as other insulation layers, depending on the particular requirements, and is not specifically limited herein.

By fabricating the separation layer between the baseboard and the flexible substrate, wherein the adhesion between the separation layer and the baseboard surface is greater than the adhesion between the separation layer and the surface of the flexible substrate, and the adhesion between the flexible substrate and the surface of the baseboard is also greater than the adhesion between the separation layer and the surface of the flexible substrate, so that compared to the conventional technology, the separation layer can be easily separated from the flexible substrate by this method, to achieve the separation of the flexible substrate from the baseboard, and finally obtain the flexible display device of the embodiment of the present application, thereby reducing the damage of the flexible substrate in the flexible display device, reducing the influence on the performance of the flexible display device, improving the yield of the flexible display device, and by adopting the low cost separation method to thereby effectively reducing the fabricating cost and is more conducive to large-scale fabrication.

Figure 14:
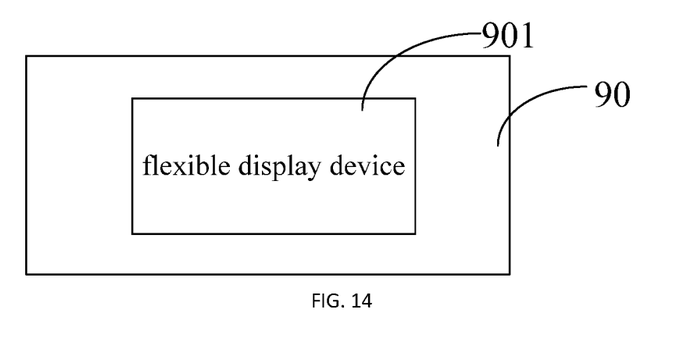
FIG. 14 is a schematic structural view of a display apparatus of an embodiment according to the present application.

Referring to FIG. 14, FIG. 14 is a schematic structural view of an embodiment of the display apparatus according to the present application. As shown in FIG. 14, the display apparatus 90 of the present application includes at least a flexible display device 901.

Wherein, the structure of the flexible display device 901 may be described with reference to the embodiment of the flexible display device of the present application shown in FIG. 13, and the partial structure may be modified according to the specific condition, and is not specifically limited herein.

Of course, in other embodiments, the display apparatus of the present application may also include other types of components such as switches, control circuits, etc., and is not specifically limited herein.

The flexible display device used in the display apparatus of the application is obtained by the fabrication method of the flexible display device of the application. Therefore, the flexible display device used in the display apparatus of the application can reduce the damage of the flexible substrate in the flexible display device, reducing the influence on the performance of the flexible display device, improving the yield of the flexible display device, and by adopting the low cost separation method to thereby effectively reducing the fabricating cost and is more conducive to large-scale fabrication.

Above are embodiments of the present application, which does not limit the scope of the present application. Any modifications, equivalent replacements or improvements within the spirit and principles of the embodiment described above should be covered by the protected scope of the invention.

What is claimed is:

1. A method for fabricating a flexible display device, comprising:
    disposing a separation layer on a surface of a baseboard;
    disposing a flexible substrate on a surface of the separation layer away from the baseboard;
    disposing a display assembly on a surface of the flexible substrate away from the separation layer;
    separating the flexible substrate from the separation layer to obtain the flexible display device; and
    wherein an adhesion between the flexible substrate and the surface of the baseboard is greater than an adhesion between the separation layer and the surface of the flexible substrate, an adhesion between the separation layer and the surface of the baseboard is greater than the adhesion between the separation layer and the surface of the flexible substrate;
    wherein, disposing a display assembly on a surface of the flexible substrate away from the separation layer comprises: depositing an inorganic film layer, a flexible baseplate, a barrier layer, a buffer layer, a display panel, and an encapsulation layer sequentially on the surface of the flexible substrate away from the separation layer;
    wherein, the step of separating the flexible substrate from the separation layer further comprises:
    cutting boundaries of the separation layer and the flexible substrate by laser to form cutting lines; wherein, the cutting lines cut sequentially into the encapsulation layer, the display panel, the buffer layer, the barrier layer, the flexible baseplate, the inorganic film layer, the flexible substrate and the separation layer to reduce film shrinkage.

2. The method according to claim 1, wherein a material of the separation layer is titanium dioxide nanoparticles.

3. The method according to claim 1, wherein the step of separating the flexible substrate from the separation layer comprises:
    separating the flexible substrate through mechanical methods from the surface in contact with the separation layer to make the flexible substrate separating from the baseboard to obtain the flexible display device.

4. The method according to claim 3, wherein the separation layer covering a first region of the surface of the baseboard, the flexible substrate covering a second region of the surface of the baseboard, wherein the second region is a region of the surface of the baseboard not covered by the separation layer.

5. The method according to claim 4, wherein the step of separating the flexible substrate through a mechanical method from a surface in contact with the separation layer comprising:
    separating the flexible substrate from the separation layer by a mechanical roller in the direction perpendicular to cutting lines.

6. The method according to claim 2, wherein disposing the separation layer on the surface of the baseboard comprises:
    coating a solution containing titanium dioxide nanoparticles on the surface of the baseboard; and
    performing a high-temperature annealing process to the solution to form the separation layer.

7. The method according to claim 1, wherein the step of disposing a flexible substrate on a surface of the separation layer away from the baseboard comprises:

coating a polyimide film on the surface of the separation layer away from the substrate to form the flexible substrate.

\* \* \* \* \*